(12) United States Patent
Simpson et al.

(10) Patent No.: US 6,747,504 B2
(45) Date of Patent: Jun. 8, 2004

(54) CONTROLLED RISE TIME OUTPUT DRIVER

(75) Inventors: Richard D. Simpson, Carlton (GB); Jonathan P. Milton, St. Albans (GB); Simon D. Forey, East Hunsbury (GB)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/223,282

(22) Filed: Aug. 19, 2002

(65) Prior Publication Data

US 2003/0117197 A1 Jun. 26, 2003

(30) Foreign Application Priority Data

Dec. 20, 2001 (EP) .......................................... 01310739

(51) Int. Cl.[7] .............................................. H03K 17/28
(52) U.S. Cl. ...................................... 327/400; 327/170
(58) Field of Search ........................ 327/170, 261–264, 327/269–272, 284, 285, 291–296, 395, 400

(56) References Cited

U.S. PATENT DOCUMENTS

| | | |
|---|---|---|
| 3,916,215 A | 10/1975 | Gaskill, Jr. et al. |
| 5,220,201 A | 6/1993 | Kawasaki et al. |
| 5,444,410 A | 8/1995 | Polhemus |
| 5,521,540 A | 5/1996 | Marbot |
| 5,652,533 A | 7/1997 | Wong et al. |
| 5,942,937 A * | 8/1999 | Bell ............................ 329/303 |
| 6,054,884 A * | 4/2000 | Lye ............................. 327/269 |
| 6,134,182 A * | 10/2000 | Pilo et al. .................... 365/233 |
| 6,219,384 B1 | 4/2001 | Kliza et al. |
| 6,259,295 B1 * | 7/2001 | Kriz et al. ................... 327/296 |

FOREIGN PATENT DOCUMENTS

| | | |
|---|---|---|
| EP | 0 302 548 A2 | 2/1989 |
| EP | 0 709 950 A2 | 5/1996 |

* cited by examiner

Primary Examiner—My-Trang Nu Ton
(74) Attorney, Agent, or Firm—Alan K. Stewart; W. James Brady, III; Frederick J. Telecky, Jr.

(57) ABSTRACT

A control slew rate output driver has a plurality of component drivers that are switched on in turn to provide an edge on the output. A control circuit provides a series of respective control signals component drivers, which are correspondingly switched on in turn. The control circuit takes a signal, preferably a data signal, and supplies it in parallel to a plurality of delay buffers, which delay the data signal by different amounts to produce the control signals for the component drivers. The delay buffers are voltage controlled and the control voltage for each is provided by a respective tap of a voltage divider. The current passes through the voltage divider can be changed to change the control voltages and, hence, the overall rise or fall time provided by the output driver.

32 Claims, 5 Drawing Sheets

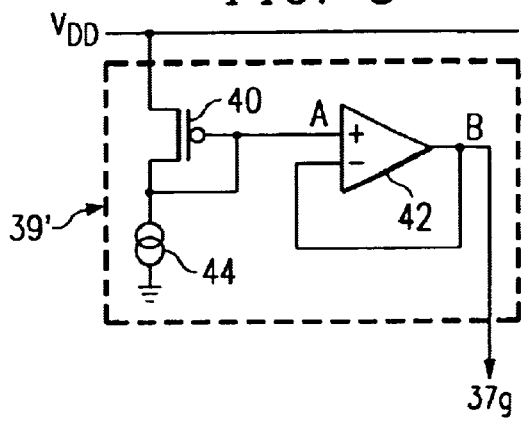
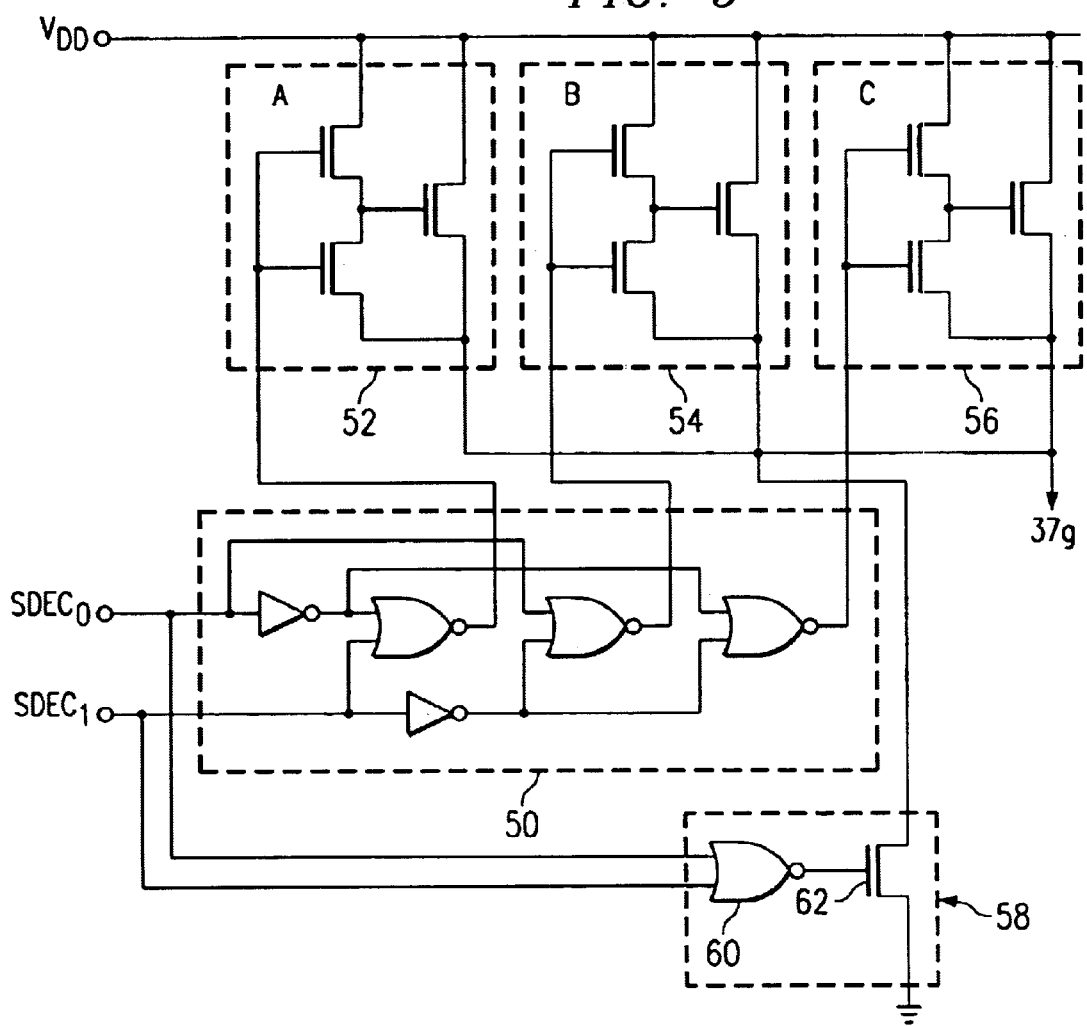

CONTROLLED RISE TIME OUTPUT DRIVER

CROSS REFERENCE TO RELATED APPLICATIONS

This application claims priority under 35 U.S.C. §119 to European Patent Application No. 01310739.6 filled on Dec. 20, 2001.

BACKGROUND OF THE INVENTION

This invention relates to controlling rise and fall times of a digital waveform, for example as produced by a line driver.

SUMMARY OF THE INVENTION

Often in the art, it is thought that digital waveforms should have rise (and fall) times that are as short as possible, and indeed in the idealised form of these waveforms that is often considered those times are taken to be zero. Short rise times mean, however, that the waveform has large high frequency components and in some applications these can cause malfunctions in circuits receiving the waveforms. Also having large high frequency components can be undesirable when transmitting the waveform, particularly for example when the high frequencies travel at a different speed.

It is an object of the invention to produce a digital waveform with controlled rise and fall times. A further object is to make those times selectable.

A known way to control an edge in an output is described in the applicant's U.S. Pat. No. 6,215,816. That arrangement provides a local area network physical layer interface device for connection to an unshielded twisted pair cable. Each edge in an output is divided into a series of sub edges each provided by separate component drivers, each triggered in turn with small delays between them. Thus, the overall rise/fall time (across all the sub edges) is controllable via the delay between each of the sub edges. The device includes synthesised rise time control for reduced electromagnetic interference, (which again is produced by high frequency components). The twisted pair is driven by component drivers that are triggered to give their contribution to the signal edge by respective taps from a ring oscillator.

DESCRIPTION OF THE DRAWINGS

An embodiment of the invention will now be described with reference to the accompanying drawings, of which

FIG. 8 shows an alternative form of match device for use in the circuit of FIG. 6

FIG. 9 shows a third arrangement for use in the circuit of FIG. 6

DETAILED DESCRIPTION OF THE INVENTION

Figure 1:
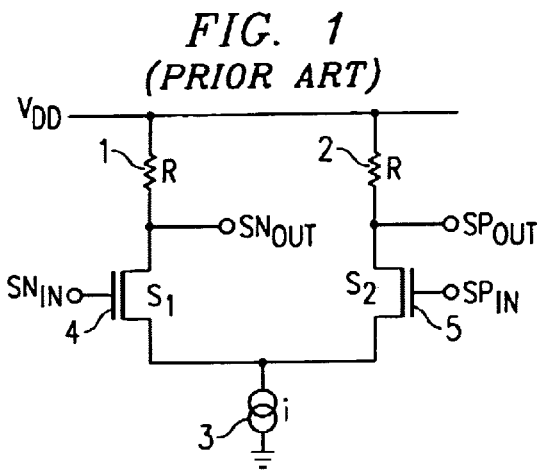
FIG. 1 is a diagram of a prior art differential amplifier arrangement

FIG. 1 shows a typical arrangement, known in the art, for differential output of a digital waveform. As mentioned above this may, for example, be used as a line driver. The resistive loads 1 and 2 (typically 50 ω) act to pull the output signals $SN_{OUT}$ and $SP_{OUT}$ up to the supply voltage $V_{DD}$ while the constant current source 3 (typically 20 mA) acts to pull the output signals $SN_{OUT}$ and $SP_{OUT}$ to ground. In use, the switches 4 and 5 are closed alternately by the complementary data input signals $SN_{IN}$ and $SP_{IN}$; the output signals $SN_{OUT}$ and $SP_{OUT}$ are therefore complementary: when one has a rising edge, the other has a falling edge.

The present invention seeks to control the overall rise (or fall) time of the output signals. A known circuit arrangement for that, shown in FIG. 2, has a series of sub-edges on the output signals. (In this example there are eight sub-edges per input signal edge.) Eight complementary pairs of switches 6,7 to 20,21 each have their own constant current source 22 to 29, each of those providing one eighth of the total current (i/8) to the $SN_{OUT}$ and $SP_{OUT}$ output nodes.

Figure 3:
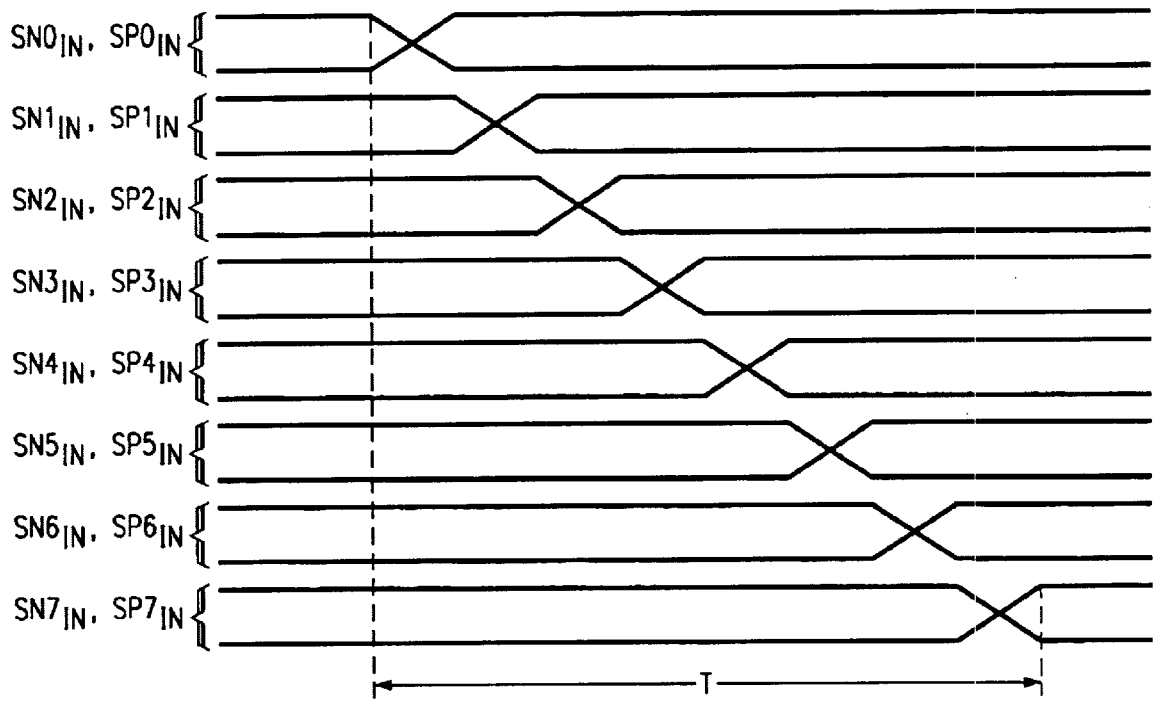
FIG. 3 shows the output waveform required

Each pair of switches is operated by a respective complementary pair of data signals $SP0_{IN}$, $SN0_{IN}$; $SP1_{IN}$, $SN1_{IN}$; . . . ; $SP7_{IN}$, $SN7_{IN}$, which signals are illustrated in FIG. 3. Each of the data signal pairs carries the same series of 1's and 0's but each pair is delayed compared to the previous pair.

At the first transition, the complementary signals $SN0_{IN}$ and $SP0_{IN}$ give rise to the first sub-edge on the output signals, $SN_{OUT}$ and $SP_{OUT}$. At the second transition, the complimentary signals $SN1_{IN}$ and $SP1_{IN}$ give the second sub-edge on the output signals, and so on. Thus, the rising (or falling) edge on the output is made up of a series of sub-edges which, in practice, because the current sources 22 to 29 are small, form a fairly smooth rising (or falling) edge with an overall rise or fall time T as marked in FIG. 3.

Another known way (not shown) to produce a set of delayed data signals like those shown in FIG. 3 is to re-time a single source data signal to each of a plurality of clock signals having different phases (using respective latches). That, however, is not suitable for use with very high frequency signals, because the clock phases required would have to be generated from a master clock signal having a much higher frequency. For example, data signals at a frequency of 3 Gbs-$_{-1}$ would require a clock frequency of 12 Gbs-$^{-1}$ or higher. Such a high frequency is very difficult to achieve.

In addition, even if a suitable high frequency clock were found, there is no ability to vary the overall rise time; it is simply dependent on the delay between the clock phases employed. The inventors have noticed, however, that a selectable total rise (or fall) time T between 50 and 400 ps (when the data is around 3 Gbs-$^{-1}$) would be useful.

Figure 4:
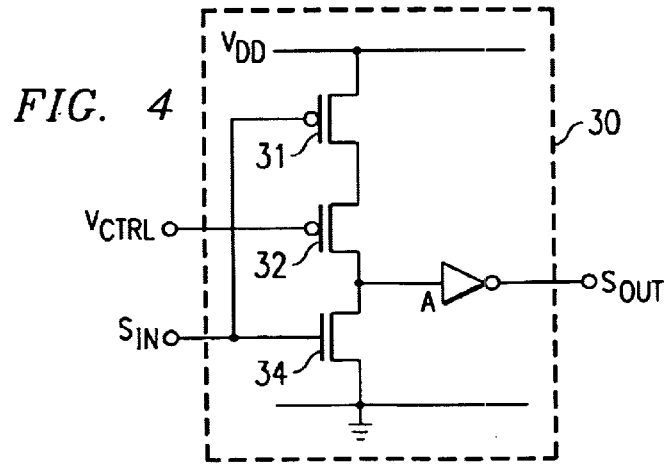
FIG. 4 is a voltage-controlled delay buffer

FIG. 4 shows a voltage-controlled delay (VCD) buffer according to the invention, generally designated 30. The VCD buffer 30 is designed to control the delay between a falling edge in the input signal $S_{IN}$ and a falling edge in the output signal $S_{OUT}$. The buffer generally comprises two inverters connected in series via a node A. The first inverter comprises pMOS transistor 31 and nMOS transistor 34 whose gates are connected to $S_{IN}$ and also comprises a resistive pMOS transistor 32 having its channel connected between the drain of transistor 31 and the common node A and having its gate connected to the control voltage $V_{CTRL}$. The second inverter 33 simply comprises the usual single pMOS and single nMOS transistors. When the input signal $S_{IN}$ switches from 1 to 0 (incoming falling edge), transistor 31 turns on, the level at node A switches from 0 to 1 and the output signal $S_{OUT}$ switches from 1 to 0 (outgoing falling edge). The resistive transistor 32 controls the rise time of level at node A, which is done in response to the control voltage $V_{CTRL}$. ($V_{CTRL}$ is defined with respect to the supply voltage $V_{DD}$ rather than ground since transistor 32 is a pMOS). Setting $V_{CTRL}$ sets the resistance R of the resistive device 32. If $V_{CTRL}$ is set to be large (i.e. near ground), the resistance R is small, so the time constant RC (capacitance C being provided by the input gate of the transistors of inverter 33) is short and the result is a quickly falling edge in the level at node A. Conversely, if $V_{CTRL}$ is set to be small (i.e. near $V_{DD}$), the result is a slowly falling edge on the level at node A.

The inverter 33 is a high threshold inverter (HTI) i.e. it switches when the node A is at about 0.8V above ground compared to around 0.6V for normal inverters (where $V_{DD}$ is 1.2V). For a falling edge on the input signal $S_{IN}$, there is a rising edge at the node A, the speed or slope of which is controlled by $V_{CTRL}$. The HTI 33, since it will not switch until node A has risen to 0.8V, converts that rise time to a delay between the falling edge on the input signal $S_{IN}$ and the corresponding falling edge on the output signal $S_{OUT}$. So a quickly rising edge at A means a short delay on the output signal $S_{OUT}$ and a slowly rising edge at A means a longer delay on the output signal $S_{OUT}$. Thus, the falling edge on the input signal $S_{IN}$ results in a falling edge on the output signal $S_{OUT}$ after a controlled time delay.

If the input signal $S_{IN}$ changes from 0 to 1 (rising edge) the edge passes through the VCD buffer 30 quickly and relatively unaffected through the action of transistor 34 pulling node A to ground. Delay on the rising edges is independent of the control voltage $V_{CTRL}$, since the resistive device 32 is not involved in propagating the edge, the edge being propagated by transistor 34 which has a low resistance in its on state.

Thus, the voltage-controlled delay buffer 30 only delays a falling edge on the input signal $S_{IN}$, and allows a rising edge to pass straight through the VCD buffer 30 with no significant delay. The control voltage $V_{CTRL}$ can be set to a voltage that is appropriate for the required delay to the falling edge.

As described above, the VCD buffer 30 in FIG. 4 is designed to control the delay between a falling edge in the input signal $S_{IN}$ and a falling edge in the output signal $S_{OUT}$. The arrangement of FIG. 4 could, of course, be modified to control the delay between a rising edge in the input signal $S_{IN}$ and a rising edge in the output signal $S_{OUT}$. In that case, the resistive device is swapped for an nMOS device and is moved between the pull down nMOS transistor 34 and the node A. The VCD buffer would then impart a delay to a rising edge in the input signal $S_{IN}$ (that delay being determined by the control voltage $V_{CTRL}$) and would allow a falling edge in the input signal $S_{IN}$ to pass straight through the VCD buffer with no significant delay. As before, the control voltage could be set to a voltage that is appropriate for the required delay to the incoming rising edge.

Figure 5:
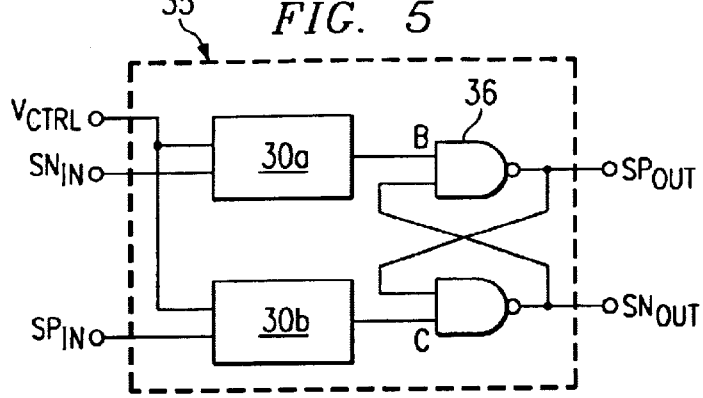
FIG. 5 shows the voltage-controlled delay buffer of FIG. 4 incorporated into a flip-flop arrangement to deal with a complementary pair of signals

FIG. 5 shows a complementary VCD buffer 35 for dealing with a complementary pair of input data signals $SN_{IN}$ and $SP_{IN}$. It comprises two VCD buffers 30a and 30b, each as shown in FIG. 4, and a flip-flop 36. Both component VCD buffers 30a and 30b are connected to the same $V_{CTRL}$ (in particular to the gates of their transistors 32—not shown in FIG. 5). 30a is connected to signal $SN_{IN}$ and 30b to signal $SP_{IN}$. The outputs of the VCD buffers 30a and 30b are connected to respective inputs B and C of the flip-flop 36.

Since $SN_{IN}$ and $SP_{IN}$ are complementary, as one has a rising edge the other has a falling edge and vice versa. The flip-flop 36 will, however, respond only to a falling edge at either of its inputs B and C. A falling edge at either B or C flips the output signals $SN_{OUT}$ and $SP_{OUT}$. A rising edge at either B or C leaves the output signals $SN_{OUT}$ and $SP_{OUT}$ unchanged. If, taking one case, $SN_{IN}$ has a falling edge and at the same time $SP_{IN}$ has a rising edge, the falling edge on $SN_{IN}$ passes through the VCD buffer 30a with a delay determined by the control voltage $V_{CTRL}$. The rising edge on $SP_{IN}$ passes through the VCD buffer 30b unaffected. The rising edge at C from $SP_{IN}$ leaves the output signals $SP_{OUT}$ and $SN_{OUT}$ unchanged. The delayed falling edge at B from $SP_{IN}$ then causes the output signals $SP_{OUT}$ and $SN_{OUT}$ to flip.

Similarly, in the other case, if $SP_{IN}$ has a falling edge and $SN_{IN}$ has a rising edge, the falling edge in $SP_{IN}$ passes through the VCD buffer 30b with a delay determined by the control voltage $V_{CTRL}$. The rising edge on $SN_{IN}$ passes through the VCD buffer 30a unaffected. The rising edge at B from $SN_{IN}$ leaves the output signals $SP_{OUT}$ and $SN_{OUT}$ unchanged and the delayed falling edge at C then causes the output signals $SP_{OUT}$ and $SN_{OUT}$ to flip. Thus, in both cases the flip-flop 36 flips only after the delayed falling edge.

The time delay $\Delta t$ between the falling edge on the input signal (e.g. $SN_{IN}$, $SP_{IN}$) and the falling edge on the output signal (e.g. $SP_{IN}$, $SP_{OUT}$) is inversely proportional to $I_D$ ($\Delta t \propto 1/I_D$) where $I_D$ is the drain current in PMOS transistor 31 of VCD buffer 30 (see FIG. 4). $I_D$ is proportional to the square of the control voltage $V_{CTRL}$ ($I_D \propto V_{CTRL}^2$). Thus $$\Delta t \propto 1/V_{CTRL}^2$$

So an increase in the control voltage $V_{CTRL}$ (i.e. measured down from $V_{DD}$), results in a decrease in the time delay $\Delta t$ according to the squared relationship above.

In the flip-flop arrangement of FIG. 5, the output signals are both switched in response to a falling edge on either of the input signals of a complementary pair. The rising edge on the other input signal leaves the output signals unchanged. A predetermined delay is introduced to the output signal flip (by virtue of the control voltage $V_{CTRL}$.). Thus, the delay element only has to control one edge so there is no need to match delays on rising and falling edges. Therefore, the output signals are balanced because they are both responding to only one edge, which edge is then effectively duplicated in the complementary output signal.

Figure 6:
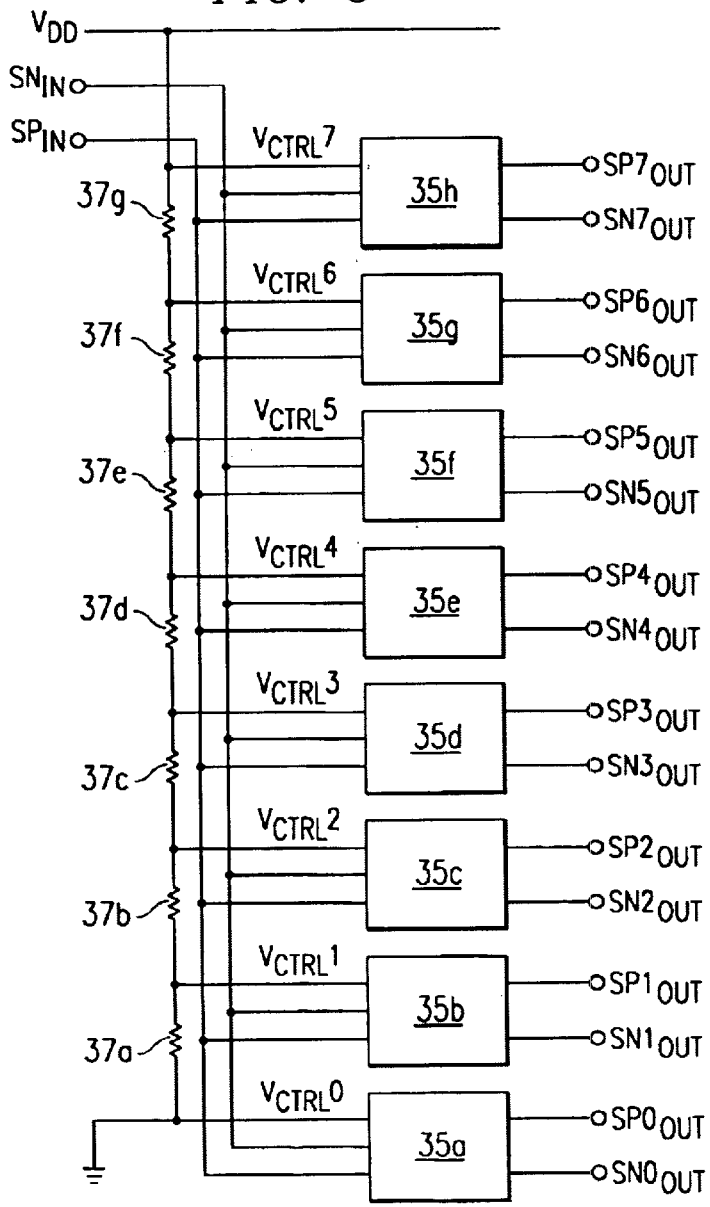
FIG. 6 shows the complementary delay buffer arrangement of FIG. 5 used in a control circuit to provide control signals to drive the differential amplifier of FIG. 2

FIG. 6 shows the complementary VCD buffer 35 used in an application for example in a line driver. The input signals $SN_{IN}$ and $SP_{IN}$ are complementary input data signals. Multiple complementary VCD buffers 35a to 35h are all connected to receive that complementary data pair and, of course, they respond only to the falling edges in those signals, to flip the output signals. The output signals $SN0_{OUT}$ and $SP0_{OUT}$ have the smallest time delay $\Delta t_0$. This is because the control voltage for 35a, $V_{CTRL0}$ is grounded directly so $V_{CTRL0}$ is the full supply voltage $V_{DD}$ (each $V_{CTRL}$ being measured down from the supply voltage $V_{DD}$ rather than ground). The delay $\Delta t_0$ is therefore a minimum. Control voltages for the other complementary VCD buffers 35b to 35h are provided by a voltage divider comprising a ladder of resistors 37a to 37g connected between $V_{DD}$ and ground. Similarly, there is a delay $\Delta t_1$ before the output signals $SN1_{OUT}$ and $SP1_{OUT}$ switch. This is set by the control voltage to 35b, $V_{CTRL1}$, which is in turn set by the resistor 37a. Again, there is a delay $\Delta t_2$ before the output signals $SN2_{OUT}$ and $SP2_{OUT}$ change. This is set by the control voltage to 35c, $V_{CTRL2}$, which is in turn set by the resistors 37a and 37b. So the first outputs to switch are $SN0_{OUT}$ and $SP0_{OUT}$, followed by $SN1_{OUT}$ and $SP1_{OUT}$ and continuing up the chain so that the $SN7_{OUT}$ and $SP7_{OUT}$ outputs are the last to switch. Thus, the required signal as shown in FIG. 3 is obtained. Since the time delay on the outputs $SN0_{OUT}$ and $SP0_{OUT}$ is the shortest and the time delay on the outputs $SN7_{OUT}$ and $SP7_{OUT}$ is the longest, the resistance of the resistors 37 must generally increase from 37g to 37a.

The delay between each of the eight delay stages is set by the control voltage to that stage, which is in turn set by the resistor combination to that stage. For a delay to each stage to be equal to the last stage, (that is $\Delta t_1=2\Delta t_0$, $\Delta t_2=3\Delta t_0$ and so on up the chain), it has been found that a squared relationship between the control resistors 37 is required.

Resistors 37a to 37g vary in resistance with temperature, but since they vary together, the voltages provided by the ladder are insensitive to temperature.

In the simple circuit of FIG. 6, each control voltage $V_{CTRL}$ is simply a percentage of the total supply voltage $V_{DD}$. But in practice, there are some problems with this arrangement.

Firstly, the supply voltage $V_{DD}$ may vary slightly, which results in variations in the control voltages, $V_{CTRL}$. Secondly, from circuit to circuit, the ratios of the resistors of the ladder may be slightly different, resulting in variation in control voltages $V_{CTRL}$ between from circuit to circuit (i.e. "process variation").

Figure 7:
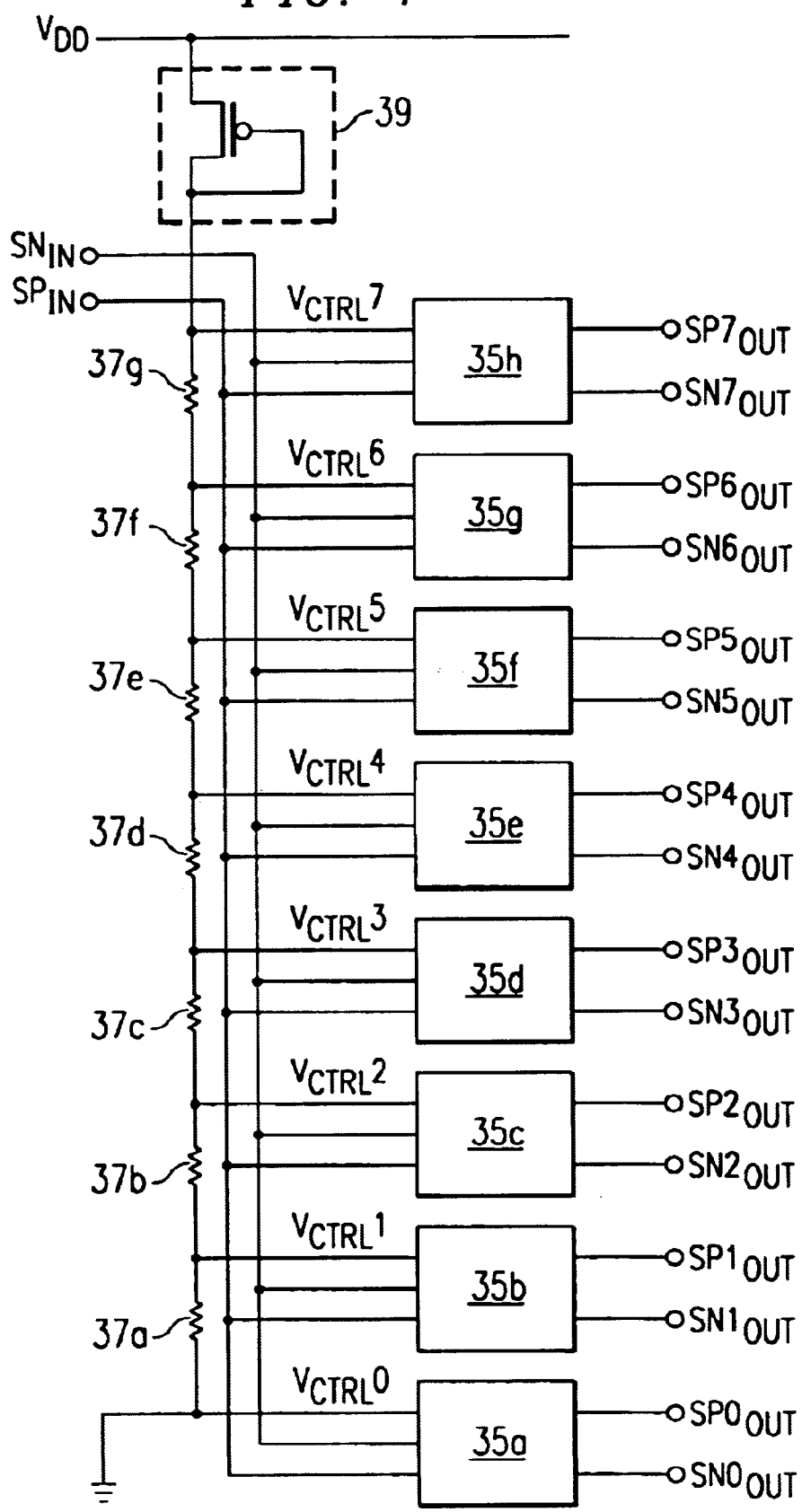
FIG. 7 shows the circuit of FIG. 6 also including a match device

To deal with these problems, a match device may be added between the top of the resistor ladder and the supply voltage $V_{DD}$. FIG. 7 shows such a match device 39.

The match device 39 consists of a pMOS FET with source and gate connected. Above a certain voltage threshold (pinchoff point), the drain current saturates and is independent of the drain voltage (supply voltage). Thus, the match device 39 acts as a constant current source. Therefore, variations in supply voltage do not result in variations in control voltages $V_{CTRL}$ since the voltage level at the top of the resistor ladder is effectively set by the match device 39 and the total resistance of the ladder. In addition, the match device provides some form of compensation between circuits depending on slight variations in the control resistors, thereby effectively ironing out differences between circuits.

FIG. 8 shows an alternative type of match device 39' which can be added between the resistor ladder and the supply voltage in the arrangement of FIG. 6. PMOS transistor 40 is a match device as in FIG. 7. Voltage follower 42 supplies the voltage at the drain of the match device 40 without drawing any current. The match device 40 is a buffer which aims to eliminate differences between the voltage at A and the voltage at B (the top of the resistor ladder). The current source 44 sets the current through the match device 40 and is designed to give the same current independent of process and temperature variations. Such current source circuits are well known in the art. Because match device 40 and transistors 32 of the delay buffers 30a and 30b of complementary VCD buffer 35h have the same bias the currents in them are related, and indeed the same if the devices are identical. Thus, the rise time in that delay buffer is controlled by current source 44. Similarly the currents through the transistors 32 in complementary VCD buffers 35a to 35g and the associated rise times are also controlled by current source 44.

FIG. 9 shows another arrangement which can be added between the resistor ladder and the supply voltage in the arrangement of FIG. 6. This arrangement allows a match device to be selected from three possible devices that provide different currents (and hence different voltage levels at the top of the resistor ladder).

A decoder, generally designated 50, has two input signals $SDEC_0$ and SDEC1, and three output signals A, B, C which pass to match devices 52, 54 and 56 respectively. The decoder 50 converts the two input signals $SDEC_0$ and $SDEC_1$ to four possible states in which either 52 is active or 54 is active or 56 is active or none of 52, 54, 56 are active (disabled state). The match devices 52, 54, 56 are located between the supply voltage and the top of the resistor ladder, in a similar way to the match devices 39, 39' of FIGS. 7 and 8.

In this case, if $SDEC_0=0$ and $SDEC_1=0$, then A, B, C=0 and none of the match devices 52, 54, 56 are active. In that case, circuit 58 provides a voltage level to the top of the resistor ladder. The circuit 58 has inputs $SDEC_0$ and $SDEC_1$, as well as a third input for ground. $SDEC_0$ and $SDEC_1$, are the inputs of a NOR gate 60, whose output is the gate of a nMOS FET device 62. With $SDEC_0=0$ and $SDEC_1=0$ ground is connected to the source of the FET 62 and is passed to the top of the resistor ladder. This grounds all the gates of all the transistors 32 removing the delays they provide.

If, however, $SDEC_0=1$ and $SDEC_1=0$, A goes to 1 (B and C remain 0) and match device 52 is the active device. Similarly, if $SDEC_0=0$ and $SDEC_1=1$, B goes to 1 (A and C remain 0) and match device 54 is the active device. Similarly, if $SDEC_0=1$ and $SDEC_1=1$, C goes to 1 (A and B remain 0) and match device 56 is the active device. That is, the states of input signals $SDEC_0$ and SDEC1 select the appropriate match device for the top of the resistor ladder.

Clearly, the arrangement of FIG. 9 could be extended to include three input signals to the decoder, resulting in eight possible states, corresponding to one of seven match devices being active or no match device being active. The arrangement could of course be extended further to include four, five, six . . . input signals to the decoder with the appropriate number of match devices between supply voltage and the top of the resistor ladder.

Alternatively, the arrangement of FIG. 9 could be adapted so that the appropriate voltage level to the top of the resistor ladder can be selected by one match device or a combination of devices. For example, if eight possible voltage levels were required, rather than providing seven match devices, three match devices could be provided (each providing double the current of the previous one) and the input signals could then select the appropriate match device or combination of match devices to use. Clearly, the more match devices are available, the higher the resolution.

Figure 2:
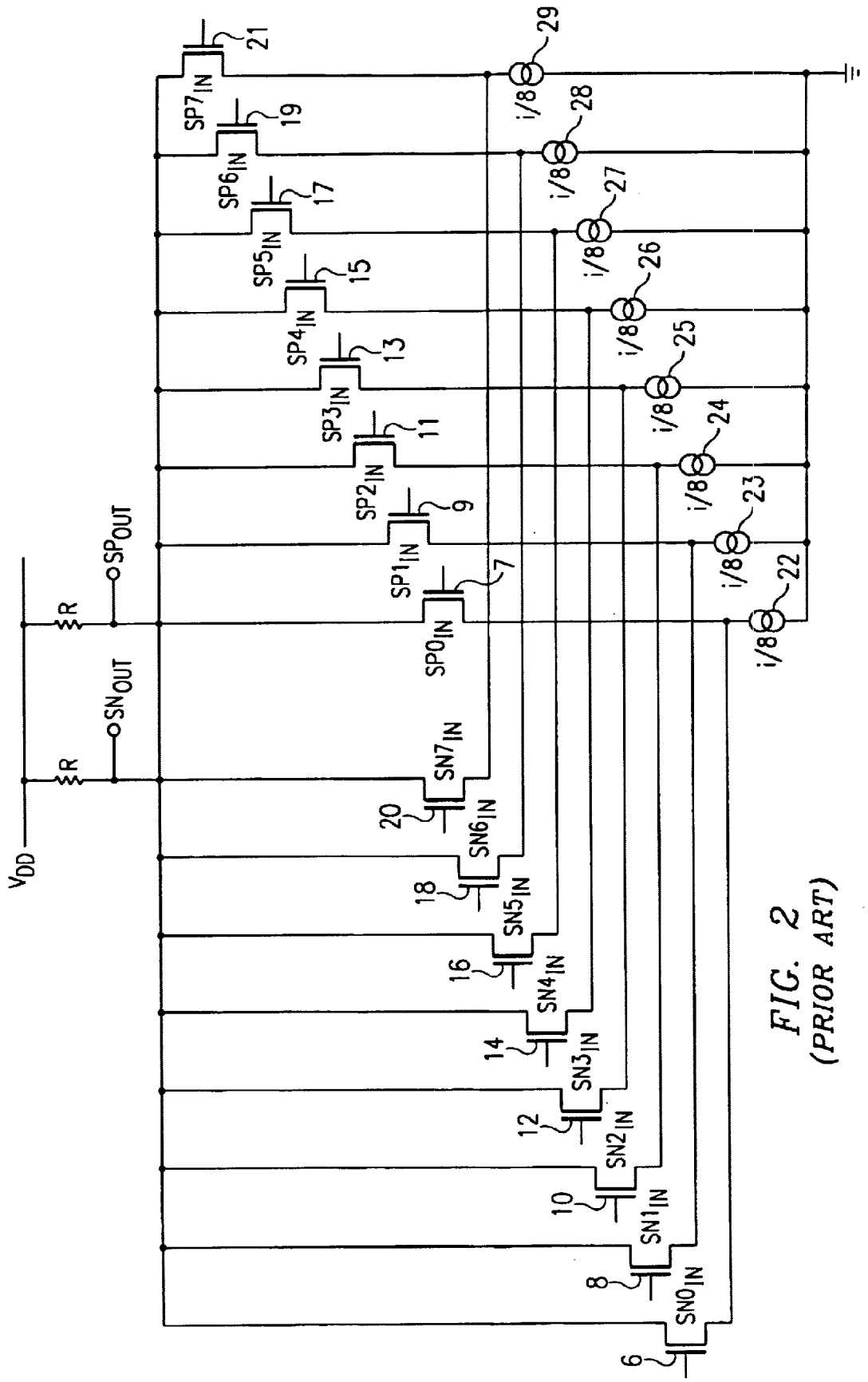
FIG. 2 is a diagram of a prior art differential amplifier arrangement adapted so as to be able to control overall rise time

Throughout, the signals $SN_{IN}$, $SN_{OUT}$, $SP_{IN}$, $SP_{OUT}$—the inputs and outputs of the delay buffers have been referred to as data signals and as such these can of course be applied to the differential amplifier of FIG. 2 to provide a similar data signal on its output. The skilled person will appreciate that if it were desired to transmit other square waves (with controlled rise and fall times) then these could be applied to the circuits of FIGS. 6 and 7 etc. in place of the data signal Further, throughout, the data signals $SN_{IN}$, $SN_{OUT}$, $SP_{IN}$, $SP_{OUT}$, have been in complementary form. Analogous circuits in which the data signal is a single digital signal (rather than a pair) are also possible. For example if the final output stage was not a differential amplifier (FIG. 2) but was a cMOS driver for a single output comprising a parallel set of pMOS transistors to pull that output up and a corresponding set of nMOS transistors to pull the output down then the nMOS and pMOS of each pair can both be driven by the same data signal (rather than by complementary versions). For this circuit, the complementary delay buffers 35a to 35h could each be replaced by the simple delay buffer of FIG. 4.

As to the complementary delay buffers, these can be modified so that the two component delay buffers are both responsive to a single version of the data signal. In that case in one of the two component delay buffers, the resistive device is swapped for an nMOS device and is moved between the pull down nMOS transistor 34 and the node A.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An output driver comprising
   a driver output,
   a plurality of component drivers each connected to the driver output and each responsive to a respective one of a plurality of component driver control signals to drive the driver output; and
   a control circuit operative to generate the plurality of component driver control signals with delays between them,
   wherein the control circuit comprises
      a master drive signal input,
      a plurality of delay buffers each connected to receive the master drive signal from its input and each operative to delay that signal to produce the plurality of component driver control signals with the delays between them, each delay buffer being connected to receive a respective delay control signal and being responsive to the level thereof in the amount of delay it provides to the master drive signal.

2. An output driver as claimed in claim 1 comprising
   a delay control signal generation means connected to receive a master delay control signal and responsive thereto to provide the plurality of delay control signals.

3. An output driver as claimed in claim 2 wherein the delay control signal generation means comprises a voltage divider with taps providing the delay control signals.

4. An output driver as claimed in claim 2 comprising
   a master delay control signal generation means.

5. An output driver as claimed in claim 4 wherein the master delay control signal generation means comprises a current source.

6. An output driver as claimed in claim 4 wherein the master delay control signal generation means is arranged to compensate for variation in delay provided by the delay buffers caused by variation in temperature.

7. An output driver as claimed in claim 6 wherein the master delay control signal generation means comprises a field effect transistor with its gate connected to its drain and the delay buffers each comprise a field effect transistor, the resistance of which is controlled by its respective delay control signal.

8. An output driver as claimed in claim 4 wherein the master delay control signal generation means is responsive to an overall delay control signal to change the master delay control signal so as to change the delays provided by the delay buffers.

9. An output driver as claimed in claim 8 wherein the master delay control signal generation means comprises a field effect transistor match device with its gate connected to its drain and a current source supplying current to the drain of the match device, the drain of the match device supplying the master delay control signal.

10. An output driver as claimed in claim 8 wherein the master delay control signal generation means comprises a plurality of current sources for supplying the master delay control signal, the master delay control signal generation means being responsive to the overall delay control signal to select which of those current sources supply, at any one time, the master delay control signal.

11. An output driver as claimed in claim 1 wherein
    the driver output has two driver output terminals,
    each component driver comprises complementary drivers connected respectively to the two driver output terminals to provide a complementary output signal on those terminals, and
    each delay buffer has two output terminals on which it provides its component driver control signals in complementary form respectively to the complementary drivers of its respective component driver.

12. An output driver as claimed in claim 1 wherein the master drive signal input has two terminals for receiving the master drive signal in complementary form and those terminals are both connected to each delay buffer.

13. An output driver as claimed in claim 1 wherein
    each delay buffer comprises first and second component delay buffers connected to receive the master drive signal and to provide at their respective outputs versions of the master drive signal that have alternate edges delayed, the edges delayed by the first component delay buffer alternating with those delayed by the second component delay buffer, and
    each delay buffer also comprises a flip-flop means responsive to the delayed edges in both the versions of the master drive signal output from the first and second component delay buffers to switch its output, that output providing the respective component driver signal.

14. An output driver as claimed in claim 13 wherein said flip-flop means comprises a flip-flop.

15. An output driver as claimed in claim 13 wherein the master drive signal input has two terminals for receiving the master drive signal in complementary form, those two terminals being respectively connected to the first and second component delay buffers of each delay buffer.

16. An output driver as claimed in claim 15 wherein the first and second component delay buffers are arranged to delay edges of the same kind, the kind of edge being either of rising and falling edges.

17. An output driver as claimed in claim 13, wherein flip-flop means provides the respective component driver signal in complementary form.

18. An output driver as claimed in claim 1 wherein said plurality of delay buffers comprise a node and drivers connected to drive that node alternately high and low and a variable resistance means connected between one of those drivers that is responsive to the master drive input signal to change its resistance.

19. A control circuit for generating a plurality of control signals with delays between them, comprising a master drive signal input;

a plurality of delay buffers each connected to receive the master drive signal from its input and each operative to delay that signal to produce the plurality of control signals with the delays between them, each delay buffer being connected to receive a respective delay control signal and being responsive to the level thereof in the amount of delay it provides to the master drive signal;

a delay control signal generation means connected to receive a master delay control signal and responsive thereto to provide the plurality of delay control signals; and a master delay control signal generation means.

20. A control circuit as claimed in claim 19 wherein the master delay control signal generation means comprises a current source.

21. A control circuit as claimed in claim 19 wherein the master delay control signal generation means is arranged to compensate for variation in delay provided by the delay buffers caused by variation in temperature.

22. A control circuit as claimed in claim 21 wherein the master delay control signal generation means comprises a field effect transistor with its gate connected to its drain and the delay buffers each comprise a field effect transistor, the resistance of which is controlled by its respective delay control signal.

23. A control circuit as claimed in claim 19 wherein the master delay control signal generation means is responsive to an overall delay control signal to change the master delay control signal so as to change the delays provided by the delay buffers.

24. A control circuit as claimed in claim 23 wherein the master delay control signal generation means comprises a field effect transistor match device with its gate connected to its drain and a current source supplying current to the drain of the match device, the drain of the match device supplying the master delay control signal.

25. A control circuit as claimed in claim 19 wherein each delay buffer has two output terminals on which it provides its control signals in complementary form.

26. A control circuit as claimed in claim 19 wherein the master drive signal input has two terminals for receiving the master drive signal in complementary form and those terminals are both connected to each delay buffer.

27. A control circuit as claimed in claim 19 wherein each delay buffer comprises first and second component delay buffers connected to receive the master drive signal and to provide at their respective outputs versions of the master drive signal that have alternate edges delayed, the edges delayed by the first component delay buffer alternating with those delayed by the second delay buffer; and each delay buffer also comprises a flip-flop means responsive to the delayed edges in both the versions of the master drive signal output from the first and second component delay buffers to switch its output, that output providing the respective control signals with the delays between them.

28. A control circuit as claimed in claim 27 wherein said flip-flop means comprises a flip-flop.

29. A control circuit as claimed in claim 27 wherein the master drive signal input has two terminals for receiving the master drive signal in complementary form, those two terminals being respectively connected to the first and second component delay buffers of each delay buffer.

30. A control circuit as claimed in claim 29 wherein the first and second component delay buffers are arranged to delay edges of the same kind, the kind of edge being either of rising and falling edges.

31. A control circuit as claimed in claim 27, wherein flip-flop means provides the respective component driver signal in complementary form.

32. A control circuit as claimed in claim 19 wherein said plurality of delay buffers comprises a node and drivers connected to drive that node alternately high and low and a variable resistance means connected between one of those drivers that is responsive to the master drive input signal to change its resistance.

* * * * *